United States Patent
Graniello et al.

(10) Patent No.: US 10,031,699 B1
(45) Date of Patent: Jul. 24, 2018

(54) READ VOLTAGE DETERMINATION IN A MEMORY DEVICE

(71) Applicant: Intel Corporation, Santa Clara, CA (US)

(72) Inventors: Benjamin A. Graniello, Chandler, AZ (US); Karthik Kumar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/787,626

(22) Filed: Oct. 18, 2017

(51) Int. Cl.
*G11C 7/00* (2006.01)
*G06F 3/06* (2006.01)
*G11C 7/22* (2006.01)
*G11C 7/10* (2006.01)

(52) U.S. Cl.
CPC .......... *G06F 3/0659* (2013.01); *G06F 3/0604* (2013.01); *G06F 3/0679* (2013.01); *G11C 7/1051* (2013.01); *G11C 7/22* (2013.01)

(58) Field of Classification Search
CPC ....... G11C 7/22; G11C 7/1075; G11C 7/1006; G11C 7/1051
USPC ......................... 365/189.14, 189.15, 189.16
See application file for complete search history.

(56) References Cited

U.S. PATENT DOCUMENTS

2014/0204671 A1*  7/2014  Sharon ................ G11C 11/5642
                                                  365/185.09

* cited by examiner

*Primary Examiner* — Son Dinh
(74) *Attorney, Agent, or Firm* — Thorpe North & Western, LLP (57) ABSTRACT

Technology for a system operable to write and read data from memory is described. The system can include memory and a memory controller. The memory controller can send an instruction to write data to a NVM address in the memory at a time of last write (TOLW). The memory controller can determine to read the data from the NVM address in the memory at read time. The memory controller can determine a read voltage to read the data from the NVM address in the memory at the read time. The read voltage can be determined based on a difference between the TOLW and the read time, and a modeled voltage drift for the NVM address over a period of time.

25 Claims, 7 Drawing Sheets

READ VOLTAGE DETERMINATION IN A MEMORY DEVICE

BACKGROUND

Memory devices are typically provided as internal, semiconductor, integrated circuits in computers or other electronic devices. There are many different types of memory including volatile memory, for example, dynamic random-access memory (DRAM) and synchronous dynamic random-access memory (SDRAM), and non-volatile memory (NVM), for example, flash memory.

Flash memory devices typically use a one-transistor memory cell that allows for high memory densities, high reliability, and low power consumption. Changes in threshold voltage of the cells, through programming of a charge storage node (e.g., a floating gate or charge trap) determine the data state of each cell. Other NVM such as phase change (PRAM) use other physical phenomena such as a physical material change or polarization to determine the data state of each cell. Common uses for flash and other solid-state memories include personal computers, digital cameras, digital media players, digital recorders, games, appliances, vehicles, wireless devices, cellular telephones, and removable portable memory modules among others. The uses for such memory continue to expand.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein.

Reference will now be made to the exemplary embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this specification, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Example Embodiments

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

Figure 1:
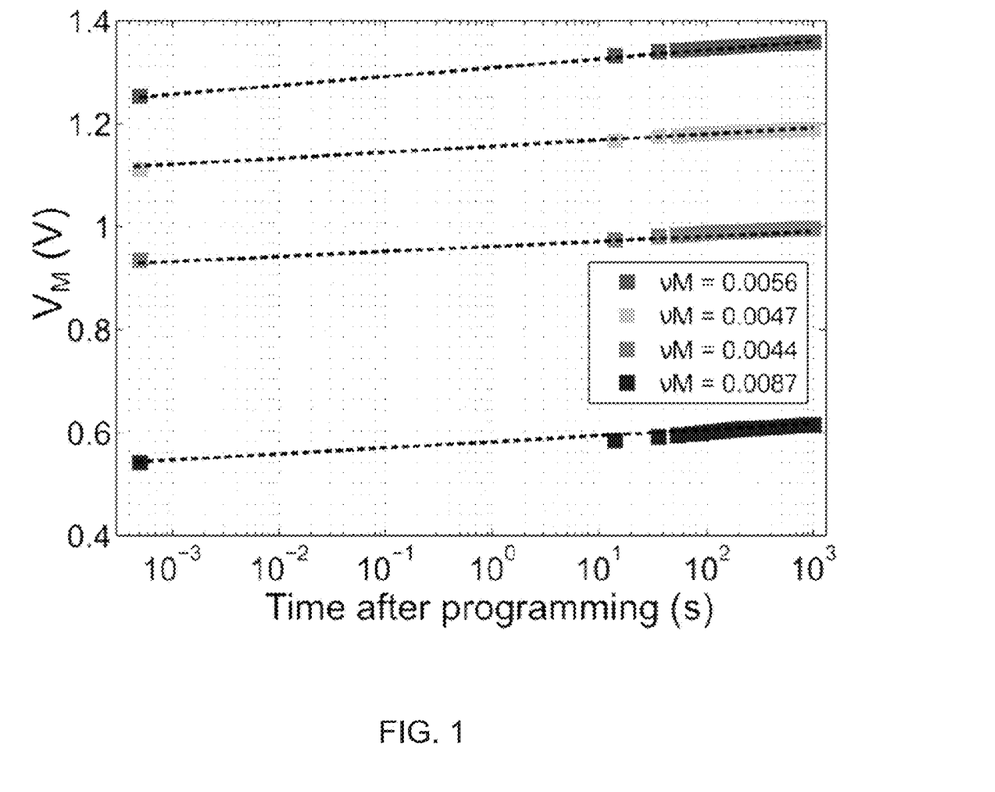
FIG. 1 illustrates a voltage drift after programming a memory cell in a memory device in accordance with an example embodiment.

Many emerging non-volatile memory (NVM) technologies have common characteristics of reading and writing data to a memory cell at different voltages, followed by a voltage drift that occurs after writing data to the memory cell. FIG. 1 illustrates an example of voltage drift after programming or writing data to a memory cell in accordance with a NVM technology. As shown, a threshold voltage ($V_M$) (in volts) can increase over time with respect to a time after programming (in seconds).

One challenge that arises due to the voltage drift in NVM technologies involves designing an efficient mechanism for performing repeated accesses to memory cells or memory addresses in a NVM device when data written to a memory address is read back out while the voltage is still drifting from the write operation. This usage pattern can be found in numerous data structures that perform a read operation immediately after a write operation on the same data. For example, this usage pattern can be found in global hash tables, for a checksum computation for a newly written page, among others.

In some cases, reading the memory address at an incorrect voltage can result in a failed read. For example, reading from the memory address immediately following writing to that memory address using the traditional read voltage can result in a read failure if the voltage is drifting. In some prior solutions a lockout time or lockout period was imposed on a memory address (or a memory location) following a write operation in order to avoid read failures. The lockout time is a period during which read operations to a memory address are prevented or otherwise delayed until the voltage has stabilized following a write operation to that memory address. The lockout time is thus effectively a period of time following a write operation having a duration that is at least the duration of the expected voltage drift, or at least the duration during which failed reads can occur. After the lockout time expired, read operations could be performed on the memory address using the standard read voltage. In some cases, the lockout time can be applied to a plurality of memory addresses in a certain region of the memory device. In the prior solution, each memory address in the memory device would adhere to the same lockout time, irrespective of whether certain memory addresses were accessed frequently or infrequently.

However, applying such a lockout time to a memory address that is hot (i.e., a memory address with frequent write operations followed immediately by read operations) can be counterproductive, and can reduce system performance. In cases where memory addresses are hot, delaying read accesses for the duration of the lockout time can delay other system processes, which can be compounded in cases of sequential reads and writes to the same address or sequentially-accessed segments of a data block. In addition, such lockout delays affect not only system management processes, but can also affect the performance of running applications.

The present disclosure provides a technological solution that allows a memory address or memory cell to be immediately read from following a write operation, irrespective of voltage drift. For example, a write operation can be performed to write data to a memory address using a write voltage, and a duration of a voltage drift period (e.g., T microseconds) can be defined to account for the duration of voltage drift following the write operation. To perform a read operation on the memory address within the voltage drift period after the write operation, a drift read voltage (e.g., V1) is used that accounts for the voltage drift. In some cases, the drift read voltage (e.g., V1) can be a function of time (t–T). In other words, the drift read voltage can be a function of the voltage drift of memory cells from a time of last write (TOLW) to a time of the read operation (i.e., the read time). On the other hand, for a read operation performed outside of the voltage drift period, (i.e., t>T), a standard read voltage (e.g., V2) can be used, as the memory cells have stabilized with respect to voltage drift. In one example, the drift read voltage can be calculated for read operations performed during the voltage drift period and applied to the NVM address, and the standard read voltage can be applied for read operations following the voltage drift period. In another example, a read voltage can be calculated for a read operation regardless of the timing of the read operation with respect to the TOLW, and such calculation can generate a read voltage that is variable to account for voltage drift during the voltage drift period, and static for read times that are outside of the voltage drift period. In other words, the calculation can output a drift read voltage value for the read voltage during the voltage drift period, and a standard read voltage value for the read voltage outside of the voltage drift period. Regardless of the mechanism for determining and applying the read voltage, the value of the read voltage used for a read operation depends on the timing of the read operation following the write operation; a drift read voltage value is used for the read voltage during the voltage drift period, and the standard read voltage value is used for the read voltage following, or outside of, the voltage drift period.

The difference between the drift read voltage and the standard read voltage accounts for the voltage drift that occurs over time after the write operation. In one example, the standard read voltage (e.g., V2) can be a voltage that is applied after the voltage drift period when the memory cells have stabilized, while the drift read voltage (e.g., V1) can be an appropriate read voltage at a given read time while the electrical properties of the memory cells are in flux. Thus, the drift read voltage can be a function of the rate of change, or the expected rate of change, in the electrical properties of the memory cells from the TOLW to the read time. Additionally, in some examples the drift read voltage can be a series of discrete voltages throughout the voltage drift period, in some cases where the duration of the voltage drift period is divided into discrete time periods or bins. Thus, by using an appropriate read voltage as a function of voltage drift during the voltage drift period minimizes read failures from incorrect read voltages.

NVM is a storage medium that does not require power to maintain the state of data stored by the medium. NVM has traditionally been used for the task of memory storage, or long-term persistent storage, but new and evolving memory technologies allow the use of NVM in roles that extend beyond traditional memory storage. One example of such a role is the use of NVM as main or system memory. Non-volatile system memory (NVMsys) can combine data reliability of traditional storage with ultra-low latency and high bandwidth performance, having many advantages over traditional volatile memory, such as high density, large capacity, lower power consumption, and reduced manufacturing complexity, to name a few. Byte-addressable, write-in-place NVM such as three-dimensional (3D) cross-point memory, for example, can operate as byte-addressable memory similar to dynamic random-access memory (DRAM) or as block-addressable memory similar to NAND flash. In other words, such NVM can operate as system memory or as persistent storage memory (NVMstor). In some situations where NVM is functioning as system memory, stored data can be discarded or otherwise rendered unreadable when power to the NVMsys is interrupted. NVMsys also allows increased flexibility in data management by providing non-volatile, low-latency memory that can be located closer to a processor in a computing device. In some examples, NVMsys can reside on a DRAM bus, such that the NVMsys can provide ultra-fast DRAM-like access to data. NVMsys can also be useful in computing environments that frequently access large, complex data sets, and environments that are sensitive to downtime caused by power failures or system crashes.

Nonlimiting examples of NVM can include planar or three-dimensional (3D) NAND flash memory, including single or multi-threshold-level NAND flash memory, NOR flash memory, single or multi-level Phase Change Memory (PCM), such as chalcogenide glass PCM, planar or 3D PCM, cross-point array memory, including 3D cross-point memory, non-volatile dual in-line memory module (NVDIMM)-based memory, such as flash-based (NVDIMM-F) memory, flash/DRAM-based (NVDIMM-N) memory, persistent memory-based (NVDIMM-P) memory, 3D cross-point-based NVDIMM memory, resistive RAM (ReRAM), including metal-oxide- or oxygen vacancy-based ReRAM, such as $HfO_2$-, $Hf/HfO_x$-, $Ti/HfO_2$-, $TiO_x$-, and $TaO_x$-based ReRAM, filament-based ReRAM, such as $Ag/GeS_2$-, $ZrTe/Al_2O_3$-, and Ag-based ReRAM, programmable metallization cell (PMC) memory, such as conductive-bridging RAM (CBRAM), silicon-oxide-nitride-oxide-silicon (SONOS) memory, ferroelectric RAM (FeRAM), ferroelectric transistor RAM (Fe-TRAM), anti-ferroelectric memory, polymer memory (e.g., ferroelectric polymer memory), magnetoresistive RAM (MRAM), write-in-place non-volatile MRAM (NVMRAM), spin-transfer torque (STT) memory, spin-orbit torque (SOT) memory, nanowire memory, electrically erasable programmable read-only memory (EEPROM), nanotube RAM (NRAM), other memristor- and thyristor-based memory, spintronic magnetic junction-based memory, magnetic tunneling junction (MTJ)-based memory, domain wall (DW)-based memory, and the like, including combinations thereof. The term "memory device" can refer to the die itself and/or to a packaged memory product. NVM can be byte or block addressable. In some examples, NVM can comply with one or more standards promulgated by the Joint Electron Device Engineering Council (JEDEC), such as JESD21-C, JESD218, JESD219, JESD220-1, JESD223B, JESD223-1, or other suitable standard (the JEDEC standards cited herein are available at www.jedec.org). In one specific example, the NVM can be 3D cross-point memory.

In the present technology, a NVM address that has been identified as a hot or prioritized memory address (or a frequently accessed memory address) can be tagged using an associated priority bit. Write operations to this memory address can be tracked in a temporal access history buffer. The temporal access history buffer can be implemented at a variety of locations, and in a variety of ways, which are not seen as limiting. For example, such a buffer can be a data construct existing in virtual or physical memory, circuitry in or a part of a memory controller, including a processor-side memory controller, a memory-side memory controller, a dedicated or discrete component of a memory module, or the like, including combinations thereof. In one specific aspect, the temporal access history buffer can be located within a dual in-line memory module (DIMM) in a computing device. The temporal access history buffer can be managed as a "hot cache." When a write operation occurs to memory cells at a memory address that has been tagged as hot with the priority bit, an indication of the memory address (i.e., the memory address) and a relative timestamp of the write operation (the TOLW) can be logged or stored in the temporal access history buffer. When a subsequent read operation is initiated to the same memory location, the timestamp stored in the temporal access history buffer corresponding to the previous write operation for the memory address of that memory location can be accessed and provided to a time-to-voltage converter. In other words, a lookup is performed for the memory address indication in the temporal access history buffer and, if found, the corresponding timestamp (TOLW) is retrieved and provided to the time-to-voltage converter. The time-to-voltage converter can calculate a drift read voltage for reading the data from memory cells at the memory address derived from the TOLW corresponding to the previous write operation and the read time of the read operation. By accounting for the amount of time between writing to the memory address and the initiation to read data from that same memory address, in conjunction with a voltage drift model that is a function of the voltage drift over time after writing to the memory cells, the time-to-voltage converter can determine the drift read voltage for reading the memory address. The read time used for the calculation may not exactly align with the actual time of the read operation due to various delays that can occur between the calculation and the read operation. In one implementation, this discrepancy can be accounted for in the calculation, which can provide the drift read voltage at the time the read operation will occur. In another implementation, the calculation can provide a drift read voltage that is valid for a certain duration of time that accounts for the voltage drift, where the certain duration is selected to not allow sufficient time to pass to result in a read fail.

The time-to-voltage converter can thus determine drift read voltages, which can be used in read operations to minimize, or otherwise eliminate, read failures that can occur due to voltage drift. The drift read voltage for the read operation can be calculated per memory cell, per memory address, per memory range, or any other grouping or size of NVM. In other words, a drift read voltage to read data from one memory cell can be different than a drift read voltage to read data from another memory cell.

A clock can be utilized to generate the TOLW for prioritized memory addresses or locations, as well as to provide timing input for the calculation of the read time. The clock can include any available timing signal. In one example, the clock can be a system clock. In another example, the clock can be a real-time clock. In yet another example, the clock can be located in a memory device of a computing system. In a further example, the clock can be located in a memory controller, either as a dedicated clock or a sub-circuit of the memory controller circuitry.

In the present technology, certain NVM addresses in the memory device or certain regions of memory in the memory device can be tagged using the priority bit associated with each memory address. For example, the priority bit can be a "1" to indicate that the associated memory address is a hot or prioritized memory address, or the priority bit can be a "0" to indicate that the associated memory address is not hot or a non-prioritized memory address, or vice versa. In an alternative example, memory addresses or certain regions of memory can be predefined as being hot/prioritized or not hot/non-prioritized using a different mechanism that does not involve a priority bit. For example, an algorithm or a heuristic can be employed that detects recently accessed memory addresses or recently accessed memory regions (e.g., 4K blocks in the memory), and these memory addresses or memory regions can be flagged as being prioritized memory addresses or prioritized memory regions, respectively.

In the present technology, whenever a write operation is performed at one of these prioritized memory addresses, a timestamp of the TOLW for the write operation can be stored in the temporal access history buffer, and a time-to-voltage calculation can be performed for a subsequent read operation at the same memory address. On the other hand, for memory addresses or regions of memory in the memory device that are not prioritized areas, write operations performed at one of these memory addresses may not involve storing a timestamp in the temporal access history buffer, and time-to-voltage calculations may not be performed for subsequent read operations at these memory addresses. Therefore, the usage of the temporal access history buffer and the time-to-voltage converter may not be applicable to an entire address range (i.e., not used to track every single memory cell), but rather only for memory addresses or regions of memory that are of particular importance. It is noted that, in some examples, a lockout period can be applied to memory addresses, regions, or the like, that are not prioritized. As such, a memory subsystem can have a portion of memory that is not prioritized to which a lockout period is automatically imposed after each write operation, and a portion of memory that is prioritized to which the lockout period is not applied, and to which a time-to-voltage calculation is used to determine a read voltage.

Figure 2:
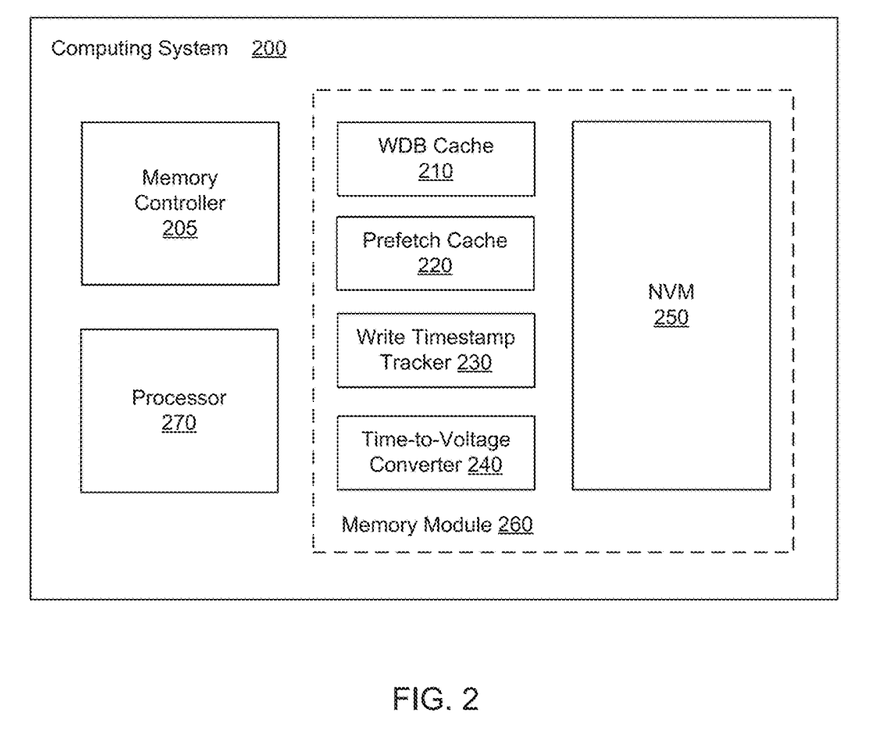
FIG. 2 illustrates a computing device with a memory module that includes a write timestamp tracker and a time-to-voltage converter in accordance with an example embodiment.

FIG. 2 illustrates an exemplary computing system 200, which can include a memory controller 205, a memory module 260, such as a dual in-line memory module (DIMM), for example, and a processor 270. The memory module 260 can include a WDB cache 210, a prefetch cache 220, a write timestamp tracker 230, a time-to-voltage converter 240 and NVM 250. Write data can be pushed into the WDB cache 210 for a period of time before being committed (or stored) in the NVM 250. The write data can reside in the WDB cache 210 in accordance with a defined policy. For example, the write data can reside in the WDB cache 210 until there is a resource constraint in the WDB cache 210, can be maintained according to a time-based policy, or the like. The prefetch cache 220 can fetch data from the NVM 250 before the data is requested by the processor 270. The prefetch cache 220 can be utilized for read operations as opposed to write operations.

In one example, the write timestamp tracker 230 can be a cache or table that tracks prioritized memory addresses or prioritized memory cells within the NVM 250. The write timestamp tracker 230 can maintain timestamps for TOLWs of data writes to these prioritized memory addresses or prioritized memory cells within the NVM 250. For example, when the memory controller 205 issues a write instruction that includes a memory address in the NVM 250 to which data is to be written to, an indication of the memory address and a timestamp for the write instruction (the TOLW) can be stored in the write timestamp tracker 230. In other words, each entry in the write timestamp tracker 230 can include a prioritized memory address and a TOLW timestamp indicating when a last write occurred at the prioritized memory address. The write timestamp tracker 230 can include a plurality of prioritized memory addresses and corresponding timestamps. In one example, the write timestamp tracker 230 may not track timestamps for all memory addresses or memory cells within the NVM 250. Rather, the write timestamp tracker 230 can track timestamps for prioritized memory addresses or prioritized memory cells within the NVM 250. More specifically, the write timestamp tracker 230 may track timestamps for memory addresses that include a priority bit indicating that the memory address is a prioritized memory address. Alternatively, the write timestamp tracker 230 can track timestamps for memory addresses that have been flagged through some algorithm or other heuristic as being prioritized. For example, when a certain memory address has been accessed a certain number of times over a defined period (i.e., a threshold is met), an indication of the memory address can be provided to the write timestamp tracker 230, and the write timestamp tracker 230 can subsequently begin to track writes to that memory address.

In one example, the time-to-voltage converter 240 can be logic or a hardware block that implements a function that models or tracks a voltage drift after a write operation is performed at a prioritized memory address in the NVM 250. The function can map a time-to-voltage with respect to the voltage drift, and the voltage over time can be linear or non-linear. The model of the voltage drift can be specific to a certain memory address, memory cell, memory region, memory type, or the like. The voltage drift over time can be modeled at a per-address level, a per-rank level, a per-memory module level, etc., such that multiple models can be used to account for variation that exists across a memory module. The time-to-voltage converter 240 can be provided with a timestamp that indicates a TOLW to a prioritized memory address in the NVM 250. The time-to-voltage converter 240 can determine, or be provided with, a read time for the read operation in the NVM 250. Based on the timestamp indicating the TOLW and the read time, the time-to-voltage converter 240 can determine an amount of time (or a delta time) that has passed between the timestamp and the read time for that particular memory address (i.e., the amount of time since the last write). The time-to-voltage converter 240 can apply the delta time to the function that models, or otherwise calculates, the estimated voltage drift that has occurred over the delta time for that particular memory address and, based on this calculation, the time-to-voltage converter 240 can determine a drift read voltage appropriate for the read time.

Figure 3A:
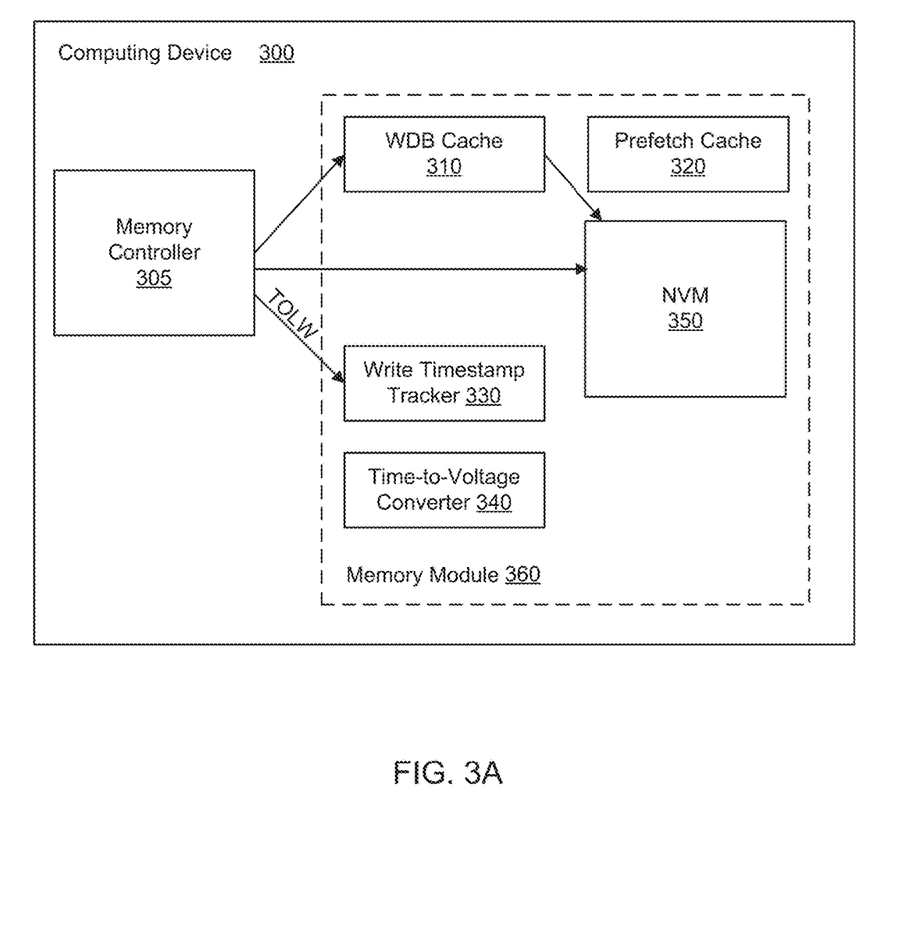
FIG. 3A illustrates a computing device with a memory module that includes a write timestamp tracker and a time-to-voltage converter in accordance with an example embodiment.
Figure 3B:
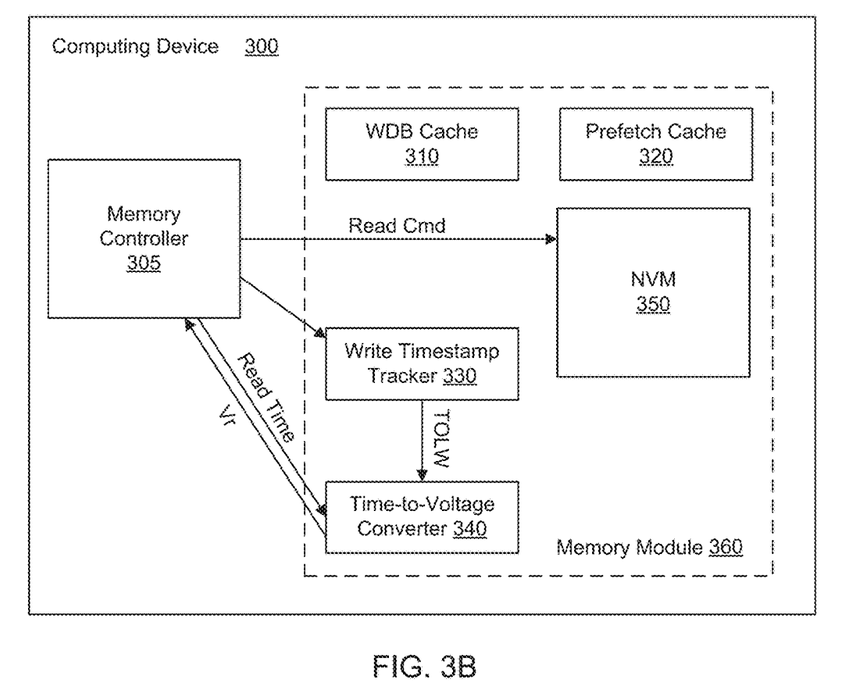
FIG. 3B illustrates a computing device with a memory module that includes a write timestamp tracker and a time-to-voltage converter in accordance with an example embodiment.

FIG. 3A illustrates an exemplary computing device 300, which can include a memory controller 305 and a memory module 360, such as a DIMM, for example. The memory module 360 can include a WDB cache 310, a prefetch cache 320, a write timestamp tracker 330, a time-to-voltage converter 340 and NVM 350. As an operational example, the memory controller 305 sends a write command to a prioritized memory address, which is indicated as such by an associated priority bit. The memory controller 305 can send the data to be written to the WDB cache 310 for storage prior to writing to the memory address, or to be written directly to the memory address without caching. The data is subsequently written to the prioritized memory address, either from the WDB cache 310 or directly from the memory controller 305, and a timestamp of the TOLW is generated and stored in the timestamp tracker 330, along with the prioritized memory address or some other indication of the memory address. The TOLW can be generated by the memory controller 305, by timestamp circuitry in the memory module 360, or the like In FIG. 3B, the memory controller 305 receives read request for data stored at a memory address the NVM 350. It is noted that, while the operations in this example are described as being performed by the memory controller 305, it is to be understood that, in other examples, circuitry in the memory module 360 can perform such operational tasks in response to receiving a memory command from the memory controller. The memory controller 305 performs a lookup of the write timestamp tracker 330 for the memory address of the requested data. If the memory address is not found in the write timestamp tracker 330, in other words, the lookup returns a miss, then the memory address is not a prioritized memory address, and the memory controller 305 generates read commands for the data using the standard read voltage. If, on the other hand, the memory address is found (i.e., the lookup returns a hit), then the memory address is a prioritized memory address, and the TOLW from the write timestamp tracker 330 is sent to the time-to-voltage converter 340, along with the read time for the read operation from the memory controller 305. The computes a delta time from the TOLW and the read time, or in other words, the duration from the TOLW to the read time, and a read voltage (Vr) is calculated as a function of the voltage drift over the delta time. The Vr can be the standard read voltage if the delta time is outside of a voltage drift period, or the Vr can be a drift read voltage if the delta time is inside of the voltage drift period. The Vr is sent to the memory controller 305, a read command is generated to read from the prioritized memory address at the appropriate Vr, and the read command is sent to the NVM 350 to retrieve the data.

Figure 4:
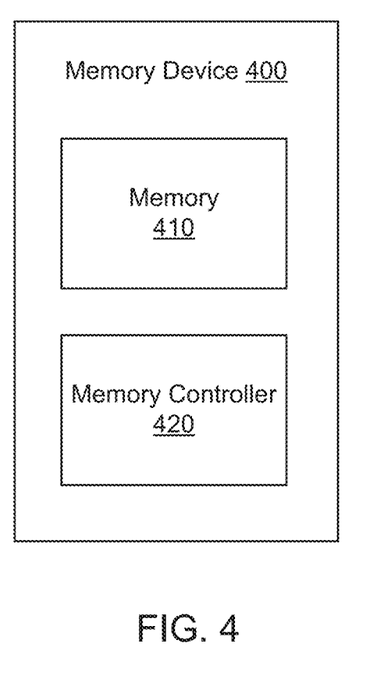
FIG. 4 illustrates a memory device operable to write and read data from memory in accordance with an example embodiment.

FIG. 4 illustrates an exemplary memory device 400 operable to write and read data from memory 410. The memory device 400 can include memory 410 and a memory controller 420. The memory controller 420 can send an instruction to write data to a NVM address in the memory 410 at a TOLW. The memory controller 420 can record, in a data store, the NVM address and the TOLW associated with the data written to the NVM address in the memory 410. The memory controller 420 can determine to read the data from the NVM address in the memory 410 at a read time. The memory controller 420 can identify, in response to determining to read the data, the NVM address in the data store to retrieve the TOLW associated with the data written to the NVM address in the memory 410. The memory controller 420 can determine a read voltage to read the data from the NVM address in the memory 410 at the read time. The read voltage can be determined based on a difference between the TOLW and the read time, and a modeled voltage drift for the NVM address over a period of time.

Figure 5:
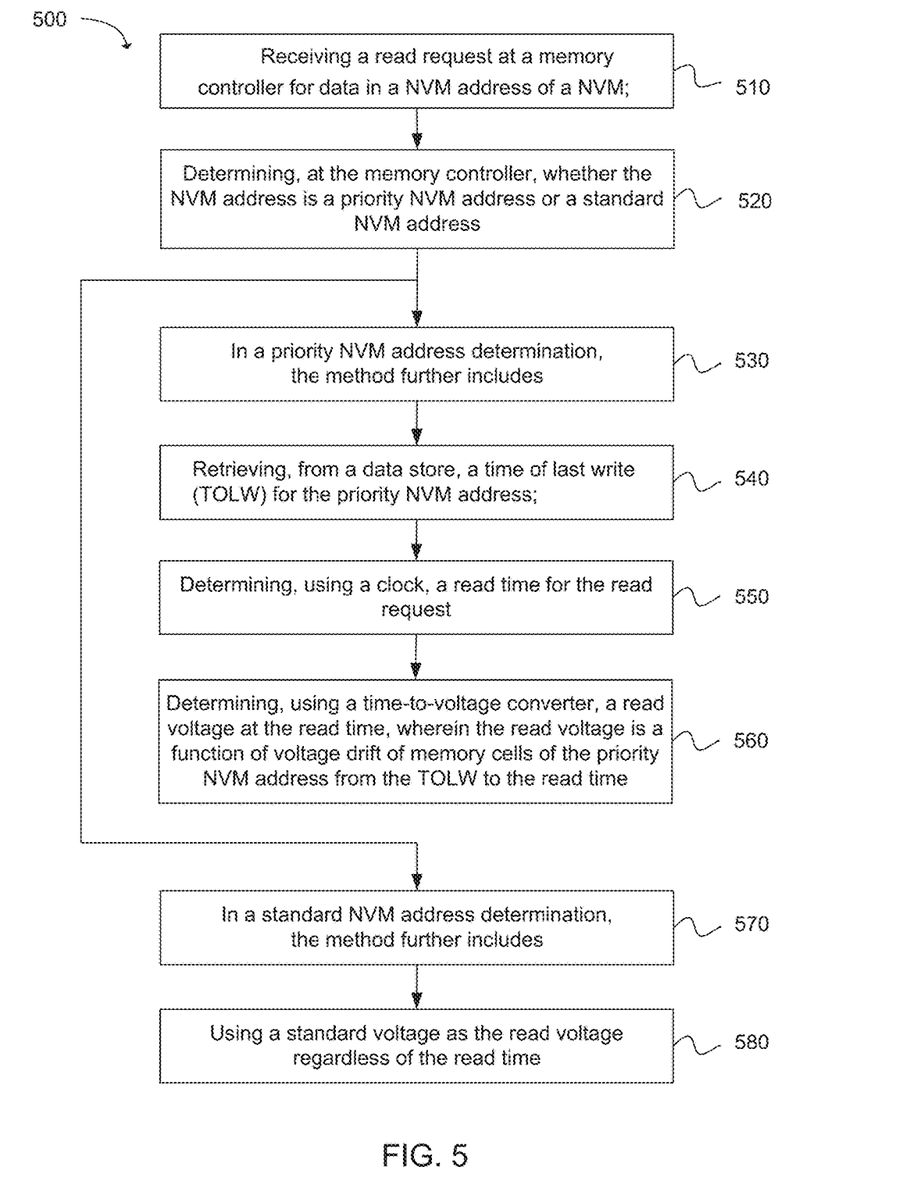
FIG. 5 is a flowchart illustrating operations for reading data from memory in accordance with an example embodiment.

Another example provides a method 500 for adjusting a read voltage to account for voltage drift following a write operation in a NVM, as shown in the flow chart in FIG. 5. The method can be executed as instructions on a machine, where the instructions are included on at least one computer readable medium or one non-transitory machine-readable storage medium. The method can include the operation of 510 receiving a read request at a memory controller for data to a NVM address of a NVM, and 520 determining, at the memory controller, whether the NVM address is a priority NVM address or a standard NVM address. In a priority NVM address determination 530, the method further includes 540 retrieving, from a data store, a time of last write (TOLW) for the priority NVM address, 550 determining, using a clock, a read time for the read request, and 560 determining, using a time-to-voltage converter, a read voltage at the read time, wherein the read voltage is a function of voltage drift of memory cells of the priority NVM address from the TOLW to the read time. In a standard NVM address determination 570, the method further includes 580 using a standard voltage as the read voltage regardless of the read time.

Figure 6:
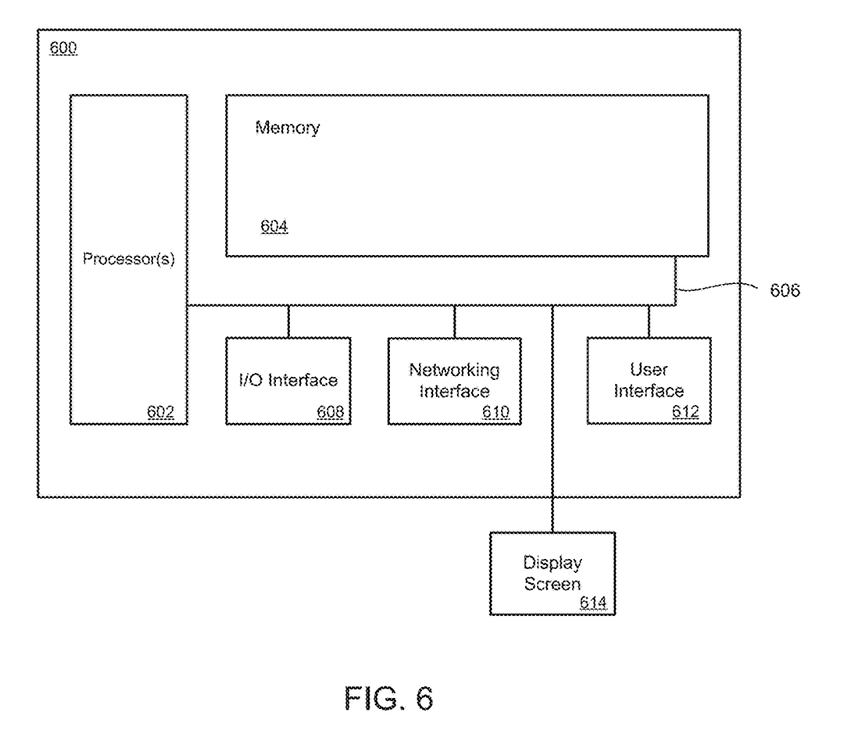
FIG. 6 illustrates a computing system that includes a data storage device in accordance with an example embodiment.

FIG. 6 illustrates a general computing system or device 600 that can be employed in the present technology. The computing system 600 can include a processor 602 in communication with a memory 604. The memory 604 can include any device, combination of devices, circuitry, and the like that is capable of storing, accessing, organizing, and/or retrieving data. Non-limiting examples include SANs (Storage Area Network), cloud storage networks, volatile or non-volatile RAM, phase change memory, optical media, hard-drive type media, and the like, including combinations thereof.

The computing system or device 600 additionally includes a local communication interface 606 for connectivity between the various components of the system. For example, the local communication interface 606 can be a local data bus and/or any related address or control busses as may be desired.

The computing system or device 600 can also include an I/O (input/output) interface 608 for controlling the I/O functions of the system, as well as for I/O connectivity to devices outside of the computing system 600. A network interface 610 can also be included for network connectivity. The network interface 610 can control network communications both within the system and outside of the system. The network interface can include a wired interface, a wireless interface, a Bluetooth interface, optical interface, and the like, including appropriate combinations thereof. Furthermore, the computing system 600 can additionally include a user interface 612, a display device 614, as well as various other components that would be beneficial for such a system.

The processor 602 can be a single or multiple processors, and the memory 604 can be a single or multiple memories. The local communication interface 606 can be used as a pathway to facilitate communication between any of a single processor, multiple processors, a single memory, multiple memories, the various interfaces, and the like, in any useful combination.

As used herein, the term "processor" can include a single processor or multiple processors, including single core processors and multi-core processors. A processor can include general purpose processors, specialized processors such as central processing units (CPUs), graphics processing units (GPUs), digital signal processors (DSPs), microcontrollers (MCUs), microprocessors, embedded controllers (ECs), embedded processors, field programmable gate arrays (FPGAs), network processors, hand-held or mobile processors, application-specific instruction set processors (ASIPs), application-specific integrated circuit processors (ASICs), co-processors, and the like or other types of specialized processors, as well as base band processors used in transceivers to send, receive, and process wireless communications. Additionally, a processor can be packaged in numerous configurations, which is not limiting. For example, a processor can be packaged in a common processor package, a multi-core processor package, a system-on-chip (SoC) package, a system-in-package (SiP) package, a system-on-package (SOP) package, and the like.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and NVM and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The system can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object-oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

Examples

The following examples pertain to specific invention embodiments and point out specific features, elements, or steps that can be used or otherwise combined in achieving such embodiments.

In one example there is provided a memory device, including a nonvolatile memory (NVM) subject to voltage drift, and a memory controller configured to receive a read request for data to a NVM address in the NVM, determine a time of last write (TOLW) for the NVM address, determine a read time for the read request, and determine a read voltage at the read time, wherein the read voltage is a function of voltage drift of memory cells of the NVM address from the TOLW to the read time.

In one example of the memory device, the memory controller is further configured to send a read command to read the data from the NVM address at the read time and at the read voltage.

In one example, the memory device further comprises a plurality of priority NVM addresses and a plurality of standard NVM addresses in the NVM, wherein the memory controller is further configured to for read requests to any of the plurality of priority NVM addresses, determine the TOLW for the priority NVM address, determine the read time for the read request, and determine the read voltage at the read time, wherein the read voltage is a function of voltage drift of memory cells of the priority NVM address from the TOLW to the read time, and for read requests to any of the plurality of standard NVM addresses, use a standard voltage as the read voltage regardless of the read time.

In one example, the memory device further comprises a priority identifier to distinguish priority NVM addresses from standard NVM addresses.

In one example of the memory device, the priority identifier is a plurality of priority bits, each associated with one of the plurality of priority NVM addresses.

In one example of the memory device, the priority identifier comprises a contiguous or non-contiguous priority region of NVM, in which NVM addresses located in the priority region are priority NVM addresses.

In one example of the memory device, in response to receiving a request to write data to one of the plurality of priority NVM addresses, the memory controller is further configured to write the data to the priority NVM address and record, in a data store, the priority NVM address and the TOLW.

In one example of the memory device, the memory controller is further configured to send a read command to read the data from the priority NVM address at the read time and at the read voltage without adhering to a lockout time.

In one example of the memory device, the memory controller is further configured to use the standard voltage as the read voltage for priority NVM addresses if the read time is outside of a voltage drift period initiated from the TOLW.

In one example there is provided a computing system, including
a processor, a memory device comprising a nonvolatile memory (NVM) subject to voltage drift and including a plurality of priority NVM addresses and a plurality of standard NVM addresses distinguished by a priority identifier, and a memory controller configured to for read requests for data to any of the plurality of priority NVM addresses, determine a time of last write (TOLW) for the priority NVM address, determine a read time for the read request, and determine a read voltage at the read time, wherein the read voltage is a function of voltage drift of memory cells of the priority NVM address from the TOLW to the read time, and for read requests for data to any of the plurality of standard NVM addresses, use a standard voltage as the read voltage regardless of the read time.

In one example of the system, the memory controller is further configured to send a read command to read the data from the priority NVM address at the read time and at the read voltage.

In one example of the system, the priority identifier is a plurality of priority bits, each associated with one of the plurality of priority NVM addresses.

In one example of the system, the priority identifier comprises a contiguous or non-contiguous priority region of NVM, in which NVM addresses located in the priority region are priority NVM addresses.

In one example of the system, the priority region comprises a map of priority NVM addresses.

In one example of the system, in response to receiving a request to write data to one of the plurality of priority NVM addresses, the memory controller is further configured to write the data to the priority NVM address, and record, in a data store, the priority NVM address and the TOLW.

In one example of the system the memory controller is further configured to send a read command to read the data from the priority NVM address at the read time and at the read voltage without adhering to a lockout time.

In one example of the system, the memory controller is further configured to use the standard voltage as the read voltage for priority NVM addresses if the read time is outside of a voltage drift period initiated from the TOLW.

In one example of the system, the data store is a TOLW tracking cache in the memory device.

In one example, the system further comprises a time-to-voltage converter configured to determine the read voltage at the read time.

In one example of the system, the time-to-voltage converter is in the memory device.

In one example, the system further comprises a clock to provide the TOLW and the read time.

In one example of the system, the clock is a real-time clock in the memory device.

In one example of the system, the clock is a real-time clock in the memory controller.

In one example of the system, the clock is a system clock.

In one example there is provided, a method for adjusting a read voltage to account for voltage drift following a write operation in a nonvolatile memory (NVM), including receiving a read request at a memory controller for data to a NVM address of a NVM, determining, at the memory controller, whether the NVM address is a priority NVM address or a standard NVM address, wherein, in a priority NVM address determination, the method further includes retrieving, from a data store, a time of last write (TOLW) for the priority NVM address, determining, using a clock, a read time for the read request, and determining, using a time-to-voltage converter, a read voltage at the read time, wherein the read voltage is a function of voltage drift of memory cells of the priority NVM address from the TOLW to the read time, and in a standard NVM address determination, the method further includes using a standard voltage as the read voltage regardless of the read time.

In one example, the method further comprises sending a read command from the memory controller to the NVM to read the data from the priority NVM address at the read time and at the read voltage.

In one example, the method further comprises sending the read command from the memory controller to the NVM to read the data from the priority NVM address at the read time and at the read voltage without adhering to a lockout time.

In one example, the method further comprises using the standard voltage as the read voltage for priority NVM addresses if the read time is outside of a voltage drift period initiated from the TOLW.

In one example, in response to receiving a request to write data to one of the plurality of priority NVM addresses, the method further comprises writing, using the memory controller, the data to the priority NVM address and record, in the data store, the priority NVM address and the TOLW.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory device, comprising:
a nonvolatile memory (NVM) subject to voltage drift; and
a memory controller configured to:
   receive a read request for data to a NVM address in the NVM;
   determine a time of last write (TOLW) for the NVM address;
   determine a read time for the read request; and
   determine a read voltage at the read time, wherein the read voltage is a function of voltage drift of memory cells of the NVM address from the TOLW to the read time.

2. The memory device of claim 1, wherein the memory controller is further configured to send a read command to read the data from the NVM address at the read time and at the read voltage.

3. The memory device of claim 1, further comprising a plurality of priority NVM addresses and a plurality of standard NVM addresses in the NVM, wherein the memory controller is further configured to:
   for read requests to any of the plurality of priority NVM addresses;
      determine the TOLW for the priority NVM address;
      determine the read time for the read request; and
      determine the read voltage at the read time, wherein the read voltage is a function of voltage drift of memory cells of the priority NVM address from the TOLW to the read time; and
   for read requests to any of the plurality of standard NVM addresses;
      use a standard voltage as the read voltage regardless of the read time.

4. The memory device of claim 3, further comprising a priority identifier to distinguish priority NVM addresses from standard NVM addresses.

5. The memory device of claim 4, wherein the priority identifier is a plurality of priority bits, each associated with one of the plurality of priority NVM addresses.

6. The memory device of claim 4, wherein the priority identifier comprises a contiguous or non-contiguous priority region of NVM, in which NVM addresses located in the priority region are priority NVM addresses.

7. The memory device of claim 3, wherein, in response to receiving a request to write data to one of the plurality of priority NVM addresses, the memory controller is further configured to:
   write the data to the priority NVM address; and
   record, in a data store, the priority NVM address and the TOLW.

8. The memory device of claim 3, wherein the memory controller is further configured to send a read command to read the data from the priority NVM address at the read time and at the read voltage without adhering to a lockout time.

9. The memory device of claim 3, wherein the memory controller is further configured to use the standard voltage as the read voltage for priority NVM addresses if the read time is outside of a voltage drift period initiated from the TOLW.

10. A computing system, comprising:
a processor;
a memory device comprising a nonvolatile memory (NVM) subject to voltage drift and including a plurality of priority NVM addresses and a plurality of standard NVM addresses distinguished by a priority identifier; and
a memory controller configured to:
   for read requests for data to any of the plurality of priority NVM addresses;
      determine a time of last write (TOLW) for the priority NVM address;
      determine a read time for the read request; and
      determine a read voltage at the read time, wherein the read voltage is a function of voltage drift of memory cells of the priority NVM address from the TOLW to the read time; and
   for read requests for data to any of the plurality of standard NVM addresses;
      use a standard voltage as the read voltage regardless of the read time.

11. The computing system of claim 10, wherein the memory controller is further configured to send a read command to read the data from the priority NVM address at the read time and at the read voltage.

12. The computing system of claim 10, wherein the priority identifier is a plurality of priority bits, each associated with one of the plurality of priority NVM addresses.

13. The computing system of claim 10, wherein the priority identifier comprises a contiguous or non-contiguous priority region of NVM, in which NVM addresses located in the priority region are priority NVM addresses.

14. The computing system of claim 13, wherein the priority region comprises a map of priority NVM addresses.

15. The computing system of claim 10, wherein, in response to receiving a request to write data to one of the plurality of priority NVM addresses, the memory controller is further configured to:
   write the data to the priority NVM address; and
   record, in a data store, the priority NVM address and the TOLW.

16. The computing system of claim 10, wherein the memory controller is further configured to send a read command to read the data from the priority NVM address at the read time and at the read voltage without adhering to a lockout time.

17. The computing system of claim 10, wherein the memory controller is further configured to use the standard voltage as the read voltage for priority NVM addresses if the read time is outside of a voltage drift period initiated from the TOLW.

18. The computing system of claim 15, wherein the data store is a TOLW tracking cache in the memory device.

19. The computing system of claim 10, further comprising a time-to-voltage converter configured to determine the read voltage at the read time.

20. The computing system of claim 19, wherein the time-to-voltage converter is in the memory device.

21. A method for adjusting a read voltage to account for voltage drift following a write operation in a nonvolatile memory (NVM), comprising:
  receiving a read request at a memory controller for data to a NVM address of a NVM;
  determining, at the memory controller, whether the NVM address is a priority NVM address or a standard NVM address;
  in a priority NVM address determination, the method further includes;
    retrieving, from a data store, a time of last write (TOLW) for the priority NVM address;
    determining, using a clock, a read time for the read request; and
    determining, using a time-to-voltage converter, a read voltage at the read time, wherein the read voltage is a function of voltage drift of memory cells of the priority NVM address from the TOLW to the read time; and
  in a standard NVM address determination, the method further includes;
    using a standard voltage as the read voltage regardless of the read time.

22. The method of claim 21, wherein the method further comprises sending a read command from the memory controller to the NVM to read the data from the priority NVM address at the read time and at the read voltage.

23. The method of claim 22, wherein the method further comprises sending the read command from the memory controller to the NVM to read the data from the priority NVM address at the read time and at the read voltage without adhering to a lockout time.

24. The method of claim 21, wherein the method further comprises using the standard voltage as the read voltage for priority NVM addresses if the read time is outside of a voltage drift period initiated from the TOLW.

25. The method of claim 21, wherein, in response to receiving a request to write data to one of the plurality of priority NVM addresses, the method further comprises:
  writing, using the memory controller, the data to the priority NVM address; and
  record, in the data store, the priority NVM address and the TOLW.

* * * * *